United States Patent [19]

Emigh et al.

[11] Patent Number: 5,687,600
[45] Date of Patent: Nov. 18, 1997

[54] METAL SPUTTERING TARGET ASSEMBLY

[75] Inventors: Roger Alan Emigh, Post Falls, Id.;
William Bryce Willett, Veradale, Wash.

[73] Assignee: Johnson Matthey Electronics, Inc., Spokane, Wash.

[21] Appl. No.: 690,988

[22] Filed: Aug. 1, 1996

Related U.S. Application Data

[63] Continuation of Ser. No. 329,231, Oct. 26, 1994, abandoned.

[51] Int. Cl.$^6$ .................................................. B21D 22/16
[52] U.S. Cl. .................................. 72/69; 72/82; 204/298.12
[58] Field of Search .................................. 72/69, 82, 83, 72/84, 85, 700; 204/298.12

[56] References Cited

U.S. PATENT DOCUMENTS

| | | | |
|---|---|---|---|
| 438,406 | 10/1890 | Dewey | 72/83 |
| 2,767,466 | 10/1956 | Faulkner | 72/83 |
| 2,892,431 | 6/1959 | Killian et al. | 72/82 |
| 4,041,746 | 8/1977 | Kraft | 72/83 |
| 4,290,876 | 9/1981 | Nishiyama et al. | 204/298 |
| 4,341,816 | 7/1982 | Lauterbach et al. | 427/34 |
| 4,885,075 | 12/1989 | Hillman | 204/298 |
| 4,889,772 | 12/1989 | Bergmann et al. | 428/547 |
| 4,953,778 | 9/1990 | Critton et al. | 72/83 |
| 4,961,831 | 10/1990 | Bergmann et al. | 204/192.16 |
| 4,961,832 | 10/1990 | Shagun et al. | 204/298.07 |
| 4,963,239 | 10/1990 | Shamura et al. | 204/192.12 |
| 4,963,240 | 10/1990 | Fukasawa et al. | 204/192.15 |
| 4,964,962 | 10/1990 | Nobutani et al. | 204/192.3 |
| 4,964,968 | 10/1990 | Arita | 204/298.19 |
| 4,964,969 | 10/1990 | Kasakube et al. | 204/298.12 |
| 4,966,676 | 10/1990 | Fukasawa et al. | 204/298.12 |
| 4,966,677 | 10/1990 | Aichert et al. | 204/298.21 |
| 4,971,674 | 11/1990 | Hata | 204/192.12 |
| 5,009,765 | 4/1991 | Qamar et al. | 204/298.12 |
| 5,143,590 | 9/1992 | Strothers et al. | 204/298.12 |
| 5,282,943 | 2/1994 | Lannutti et al. | 204/298.12 |

FOREIGN PATENT DOCUMENTS

| | | | |
|---|---|---|---|
| 6158497 | 7/1994 | Japan . | |
| 1648601 | 5/1991 | U.S.S.R. | 72/82 |

OTHER PUBLICATIONS

J.A. Dunlop et al., "Effects of aluminum silicon copper sputtering target processing methods on thin film uniformity and process control during very large scale integrated device fabrication", *Journal of Vacuum Science & Technology*, Second Series, vol. 11, No. 4, Part 1, Jul./Aug. 1993, pp. 1558–1565.

*Primary Examiner*—Lowell A. Larson
*Attorney, Agent, or Firm*—Christie, Parker & Hale, LLP

[57] ABSTRACT

Described is a method of manufacturing a sputtering target or backing plate for a sputtering target that minimizes metal waste and reduces manufacturing steps. The target or backing plate is made from a substantially circular metal blank by progressively deforming circumferential bands until the blank is in the shape of a sputtering target or backing plate. The target and backing plate so produced are also described.

16 Claims, 2 Drawing Sheets

METAL SPUTTERING TARGET ASSEMBLY

CROSS-REFERENCE TO RELATED APPLICATION

This is a continuation of application Ser. No. 08/329,231 filed Oct. 26, 1994, now abandoned.

FIELD OF THE INVENTION

This invention relates to the field of sputtering targets and the manufacture of such targets.

BACKGROUND OF THE INVENTION

It is well known that thin metallic and ceramic layers may be deposited upon a substrate by a technique known as magnetron sputtering. By such methods a metal layer may be sputtered in a controlled atmosphere using a target of the material to be deposited, generally as a cathode in a standard RF sputtering apparatus.

More recently, sputtering techniques have been used in the production of integrated circuits which require rapid and economical metal deposition with very, close tolerances. Sputtering is an especially useful tool for the application of films and coatings where uniformity and chemical purity is important. Manufacturing costs may be lowered by improving film uniformity and deposition rate in high-speed production processes typically used in integrated circuit manufacturing. Materials of particular importance in the manufacture of integrated circuits are aluminum and aluminum alloys. Targets of aluminum and/or aluminum alloys are used to produce an aluminum film or coating on a substrate by sputtering.

Sputtering processes and apparatus are disclosed in Bergman, et al., U.S. Pat. Nos. 4,889,772 and 4,961,831; Shagoon, et al., U.S. Pat. No. 4,961,832; Shimamura, et al., U.S. Pat. No. 4,963,239; Nobutani, et al., U.S. Pat. No. 4,964,962; Arita, U.S. Pat. No. 4,964,968; Kusakabi, et al., U.S. Pat. No. 4,964,969; and Hatta, U.S. Pat. No. 4,971,674 and the references referred to therein. Sputtering targets are discussed also in Strothers, et al., U.S. Pat. No. 5,143,590; Fukasawa, et al., U.S. Pat. Nos. 4,963,240 and 4,966,676; and Arkut, et al., U.S. Pat. No. 4,966,677. These disclosures of sputtering processes and apparatus, as well as sputtering targets of the foregoing, are expressly incorporated herein by reference.

Sputtering target assemblies are typically constructed with the target members supported on a backing member. The backing member may be of the same or different material as the target. A target member includes a target surface of material to be sputtered. The backing member is intended to hold the target member in place in a sputtering apparatus. The target member is generally processed so as to form a microstructure suitable for sputtering, and this processing can include a very large reduction in thickness of the target member. The backing member generally does not require such special processing.

Having a separate sputtering target and backing assembly requires attaching the target member to the backing member as a step in the manufacturing process. This is often done through joining methods such as welding or the like. Use of these joining methods leads to development of a heat affected zone on the sputtering target, and within such a zone the target microstructure, and thus sputtering performance, may be negatively affected. The use of a separate target and backing also introduces the potential for leaks of coolant used to cool the sputtering target during the sputtering process.

One way to eliminate welding, or other techniques requiring the application of heat to join the target to the backing plate, is to machine a single metal blank to the dimensions of the combined target and backing plate. However, such a method incurs waste due to the loss of the machined metal.

Other methods of manufacturing a unitary target and backing plate include forging and coining. In forging or coining, the flow stress of the metal is exceeded over the entire area to be deformed and generally requires an application of high pressures. The flow stress of the metal, and thus the deformation pressure required, may be reduced by heating the metal, but this can change the micro-structure of the sputtering target in a manner which will decrease sputtering performance.

Another problem arises when the target member is made of different material than the backing member. In this case it is not possible to make a unitary sputtering target since a separate backing member must be manufactured. The manufacture of backing members is often done by machining a metal blank to the shape of a backing member, which incurs a waste of metal. The use of the previously mentioned coining and forging techniques would reduce this waste, but still requires the application of large pressures, and costly machinery.

SUMMARY OF THE INVENTION

In accordance with the present invention, there is provided a substantially circular target having an extension and flange around the outer circumference, and a method of making same. The invention also contemplates a backing member formed in the same manner. The target or backing member, also referred to as a backing plate, is formed from a metal blank with a substantially circular shape by a spinforming process. The metal blank is clamped between a rotating spindle and a die, and the blank is then progressively deformed by applying pressure with a tool, such as a spinning roller, to small areas of the blank. As the blank rotates the pressure progressively deforms a circumferential band of the blank. By continuing to apply pressure at differing radials of the blank, the extension and flange of the sputtering target, or backing plate, is formed. This occurs without damage to the target microstructure.

DETAILED DESCRIPTION

The present invention provides an improved and more economical method of manufacturing sputtering targets and sputtering target backing plates which reduces material waste and provides a superior target microstructure, and the target so provided.

Figure 1:
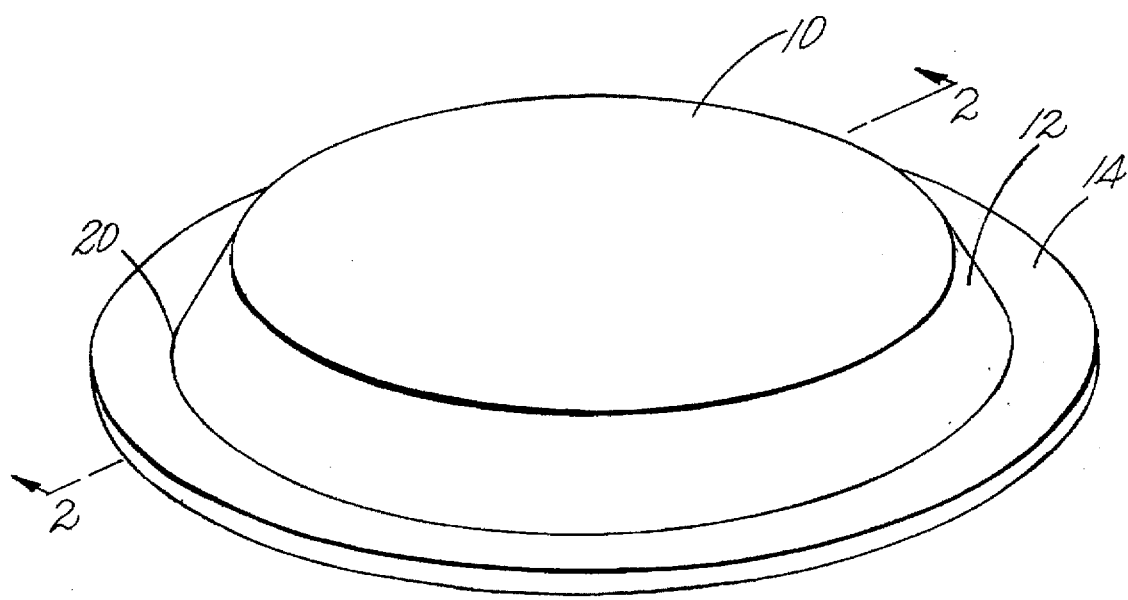
FIG. 1 and 3 are isometric views of possible spinformed sputtering targets, or sputtering target backing plates, manufactured in accordance with the invention.
Figure 2:
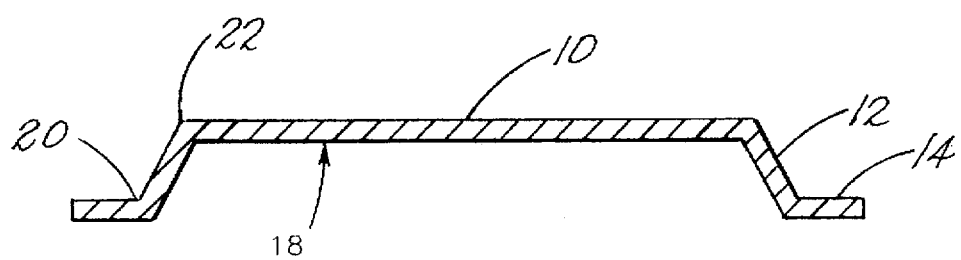
FIG. 2 and 4 are sectional side views of possible spin-formed sputtering targets, or sputtering target backing plates, manufactured in accordance with the invention.
Figure 3:
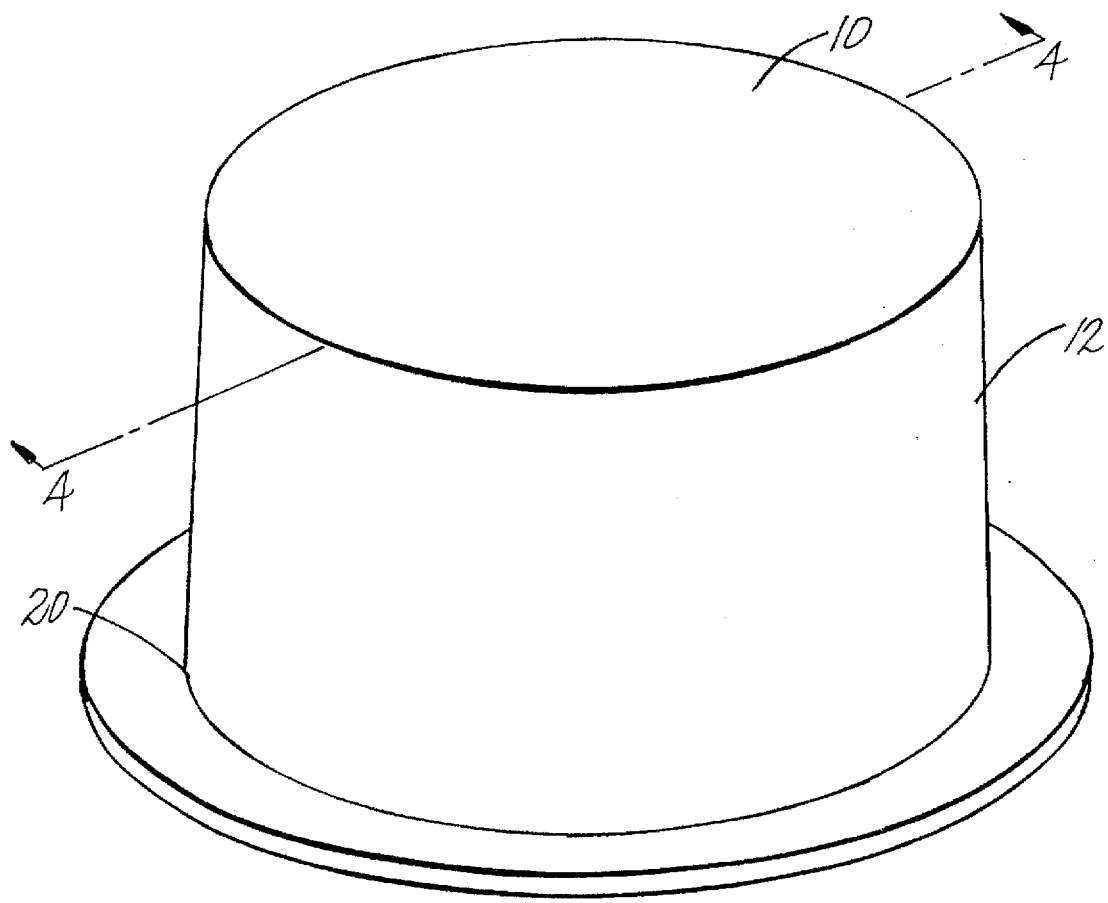
Figure 4:
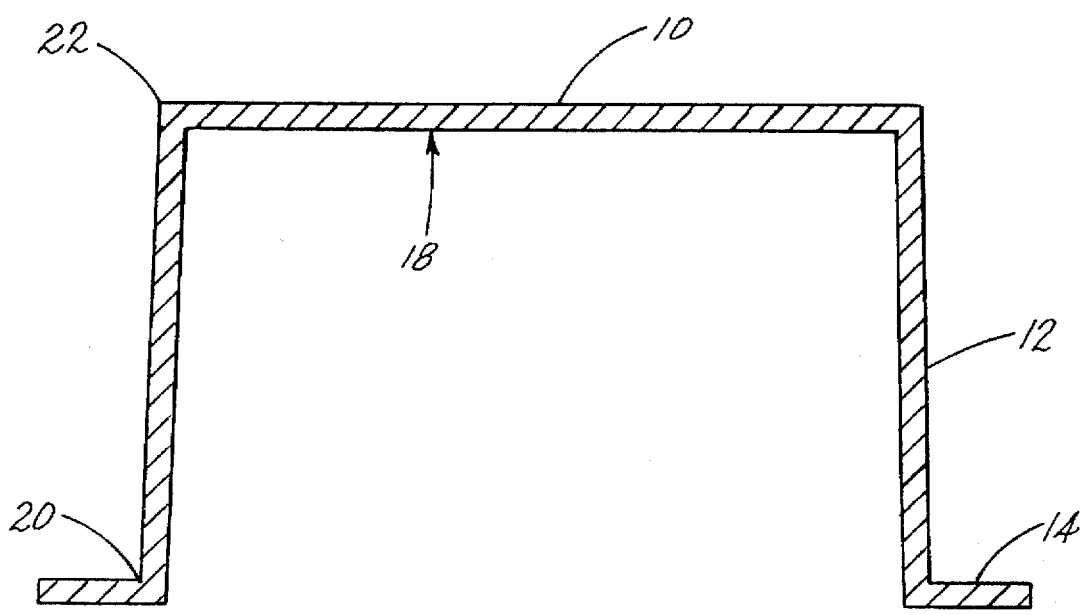

As is seen in FIGS. 1 through 4 the sputtering target or sputtering target backing plate made by the manufacturing process comprises a target area, or target bonding area if the article manufactured is a backing plate, designated as 10. This area, 10, is substantially surrounded by an extension 12, which in turn is surrounded by a flange 14. The sputtering target, or sputtering target backing plate, has a upper surface 10 and, as can be seen in FIG. 2, a lower surface 18. The area 10 to be the target area has a desired microstructure for use as a sputtering target. The extension 12 extends from the target area to the flange 14, forming a cylindrical or conical shape. Advantageously, the flange is substantially parallel to the area 10 which may be a target itself, or the target bonding surface of a backing plate.

The sputtering target or backing plate is manufactured by providing a suitable metal blank. To manufacture a target a metal blank will be provided with a microstructure suitable for use as a sputtering target. Often the processing includes a large reduction in the thickness of the metal blank. In the manufacture of a backing member the metal may be different than the metal of the target member and the microstructure of the blank is less important.

To make a target or backing plate by spinforming, the metal blank is clamped between a rotatable spindle and a die corresponding to the shape to be formed. The clamped assembly is then rotated while a tool, such as a spinning roller, is used to apply pressure, progressively, to a small area of the metal blank, thereby causing the small area to deform in the direction of pressure. As the metal blank rotates a circumferential band of the blank is progressively deformed in the direction in which pressure is applied. By moving the spinning roller in a radial direction with respect to the rotating metal blank, and along the axis of rotation, a sputtering target or backing plate may be produced.

In one embodiment of the invention the die will have a shape such that its surface will be similar to that of the lower side of a target surface area and attached extension. In this case, the clamping tool can be seen as a male die fitting into the underside, or female side, of a sputtering target. A deforming tool, such as a spinning roller, will be applied to the surface of the rotating metal blank facing the spindle, and at a position along a circumferential circle 22 which forms the area where the extension from the target, or the target bonding area, is to begin. The spinning roller is then moved in a direction substantially towards the die, so as to progressively deform the metal blank along a circumferential band. The circumferential band of the metal blank is progressively deformed until the circumferential band is substantially in contact with the die and the desired shape is produced.

In the spinforming process the spinning roller is used to progressively deform additional circumferential bands until the entire extension is formed into the desired shape. The deformation leading to the desired shape progressively occurs in an incremental manner, thus requiring less pressure than if the entire surface was deformed at once.

The metal blank may be then positioned such that the surface area towards the spindle becomes the surface towards the die, and the surface that was previously towards the die becomes the surface towards the spindle. Thus, the male die is replaced with a female die having a shape such that its surface is substantially similar to the shape of the surface of the upper surface of the sputtering target or backing plate. Pressure is again applied by a spinning roller in a manner similar to that previously described, to form the flange.

In another embodiment, a substantially circular metal blank is clamped between a rotating spindle and a die having a shape substantially similar to the lower side of the a target or backing plate. Pressure by the spinning roller is applied as described above to progressively deform the metal blank and thereby form an extension and a flange, without disturbing the target microstructure. It is apparent that the initial placement of the spinning roller along a radial line of the metal blank, along with the subsequent radial positioning of the spinning roller, may be accomplished in a variety of ways.

In yet another embodiment the metal blank to be made into a sputtering target or sputtering target backing plate may be aluminum or an aluminum alloy, copper or a copper alloy, titanium or a titanium alloy. It is also possible to preheat the metal blank to increase the ductility of the blank, which reduces the pressure required for deformation.

It is apparent from the foregoing that various changes and modifications may be made without departing from the invention. Accordingly the scope of the invention should be limited only by the appended claims.

What is claimed is:

1. A method of making a metal sputtering target assembly comprising a sputtering target having a top which includes a target surface, having substantially the same microstructure as the metal from which the target surface is made, and an extension, comprising:

providing a metal blank;

clamping the metal blank between a rotatable spindle and a die;

rotating the metal blank and the die; and deforming the metal blank by progressively applying pressure to a discrete area of the blank while rotating and continuing to apply pressure at differing radials of the blank to form the extension and the flange without causing disruption of the microstructure of the metal at the target surface, whereby the microstructure of the target surface is substantially the same as the microstructure of the metal blank from which it is made.

2. A method according to claim 1 comprising deforming the metal blank by progressively applying pressure with a spinning roller to progressively deform the metal blank and form the extension.

3. A method according to claim 1 comprising deforming the metal blank by progressively applying pressure until the surface of the metal blank is substantially in contact with the die, the die having a surface whose shape is substantially similar to the article to be formed.

4. A method according to claim 1 comprising progressively applying pressure with a spinning roller to incrementally deform the blank until the surface of the metal blank is substantially in contact with the die, the die having a surface substantially similar to the top and extension of the article to be formed; further comprising providing a second die, said second die having a surface substantially similar to the flange of the sputtering target assembly;

positioning the partially deformed metal blank into contact with the second die; and progressively deforming the extension with a spinning roller until the surface of the extension is substantially in contact with the second die.

5. A method according to claim 1 wherein the metal from which the target surface is made comprises material selected from the group consisting of aluminum and aluminum alloys, copper and copper alloys, and titanium and titanium alloys.

6. A method according to claim 1 further comprising machining the target assembly to the final desired dimensions.

7. A method according to claim 1 wherein the metal blank is preheated.

8. A method of forming a metal sputtering target assembly comprising a target surface having substantially the same microstructure as the metal from which the target surface is made, an extension and flange comprising:

provide a metal blank;

clamping the metal blank between a rotating spindle and a die; and spinforming the metal blank into a shape having a top including a target surface, an extension extending away from the top, and a flange extending from the extension without causing disruption of the microstructure of the metal at the target surface, whereby the microstructure of the target surface is substantially the same as the microstructure of the metal blank from which it is made.

9. A method according to claim 8 further comprising preheating the metal blank prior to spinforming.

10. A method according to claim 8, wherein the sputtering target assembly is formed by spinforming the metal blank into a shape having a top comprising a target surface, and an extension extending away from the top, and spinforming the extension to form the flange extending from the extension.

11. A method according to claim 8 further comprising machining the sputtering target assembly to the final desired dimensions.

12. A method according to claim 8 wherein the target surface of the sputtering target assembly is comprised of material selected from the group consisting of aluminum and aluminum alloys, copper and copper alloys, and titanium and titanium alloys.

13. A method of manufacturing a sputtering target assembly having a top comprising a target surface, an extension from the top, and a flange extending from the extension, said target surface having a desired microstructure for sputtering, comprising:

providing a metal blank, clamping the metal blank between a rotatable spindle and a die;

rotating the metal blank and the die; and deforming the metal blank by progressively applying pressure to a discrete area of the blank while rotating and continuing to apply pressure at differing radials of the blank to form the extension and the flange without disturbing the microstructure of the target surface, whereby the microstructure of the target surface is substantially the same as the microstructure of the metal blank from which it is made.

14. A method according to claim 13 wherein the metal blank comprises material selected from the group consisting of aluminum and aluminum alloys, copper and copper alloys, and titanium and titanium alloys.

15. A method according to claim 13 wherein the metal blank is incrementally deformed with a spinning roller until the surface of the metal blank is substantially in contact with the die, the die having a surface substantially similar to the upper surface and extension of the article to be formed, further comprising:

providing a second die, said second die having a surface substantially similar to the flange of the sputtering target;

positioning the partially deformed metal blank into contact with the second die; and progressively deforming the extension with a spinning roller until the surface of the extension is substantially in contact with the second die.

16. A method according to claim 13 wherein the metal blank is preheated.

* * * * *